US012663886B2

(12) United States Patent (10) Patent No.: US 12,663,886 B2

Abraham et al. (45) Date of Patent: Jun. 23, 2026

(54) INPUT/OUTPUT CAPACITANCE REDUCTION WITH NEGATIVE IMPEDANCE

(71) Applicant: Intel Corporation, Santa Clara, CA (US)

(72) Inventors: Isaac Abraham, Tacoma, WA (US); Michael W. Altmann, Folsom, CA (US); Jonathan Kolet Gamble, McMinnville, OR (US); Rodolfo Kiyama Armendariz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/860,388

(22) Filed: Jul. 8, 2022

(65) Prior Publication Data

US 2024/0012497 A1 Jan. 11, 2024

(51) Int. Cl.
| | |
|---|---|
| *G06F 3/00* | (2006.01) |
| *G06F 3/038* | (2013.01) |
| *G06F 3/041* | (2006.01) |
| *G06F 3/044* | (2006.01) |
| *H03H 11/12* | (2006.01) |
| *H03H 11/44* | (2006.01) |

(52) U.S. Cl.
CPC .......... *G06F 3/0383* (2013.01); *G06F 3/0416* (2013.01); *G06F 3/044* (2013.01); *H03H 11/1278* (2013.01); *H03H 11/44* (2013.01)

(58) Field of Classification Search
CPC ...... G06F 3/0383; G06F 3/0416; G06F 3/044; H03H 11/1278; H03H 11/44
See application file for complete search history.

(56) References Cited

U.S. PATENT DOCUMENTS

2016/0370949 A1* 12/2016 Park ...................... G06F 3/0418

OTHER PUBLICATIONS

Dutta Roy, S C, "Comments on Analysis of the Bridged T-coil Circuit Using the Extra-Element Theorem", IEEE Trans. Circuits, vol. 54, 2007, 2 pgs.
Paramesh, Jeyanandh, "Analysis of the bridged T-coil circuit using the extra-element theorem", IEEE Trans. Circuits Syst.-II, vol. 53, 2006, 5 pages.
Razavi, Behzad, "The Bridged T-Coil", IEEE Solid-State Circuits Magazine, vol. 7, No. 4, 2015, 5 pages.

* cited by examiner

*Primary Examiner* — Insa Sadio

(74) *Attorney, Agent, or Firm* — Schwegman Lundberg & Woessner, P.A.

(57) ABSTRACT

Data transfer rates input to and output from electronic devices are a function of I/O pad circuit structure. The load capacitance of an I/O pad may reduce the bandwidth of an I/O circuit. A reduced pad capacitance circuit may be used to reduce or eliminate the positive and physical pad capacitance associated with a capacitive pad. This negative capacitance reduces or minimizes poor signal quality arising from large pad capacitance. This improved signal may be fed into a comparator, where the signal may be improved further using an equalizer. The use of negative capacitance circuit will increase the transmit and receive signaling quality of I/O interfaces.

23 Claims, 8 Drawing Sheets

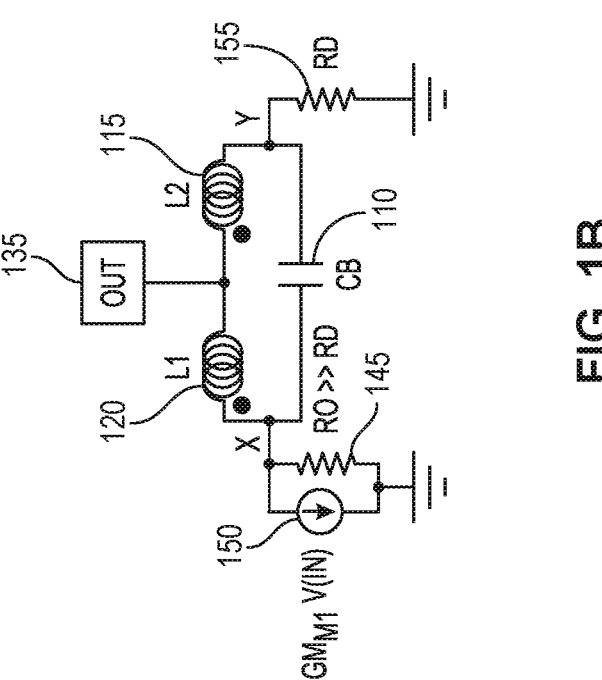
FIG. 1B
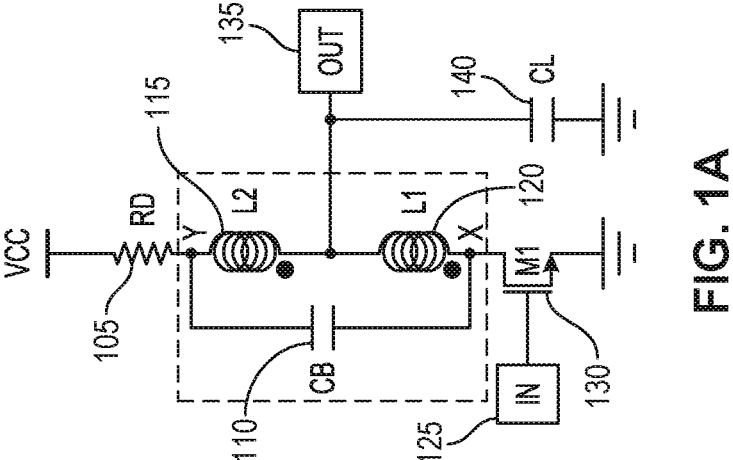
FIG. 1A

200

245
OUTRX

235
DFE
CTLE
+
−

240
REF

230
RTERM

220
−N*CPAD; N < 1

225
CPAD

215
XXPAD

210

205

FIG. 4

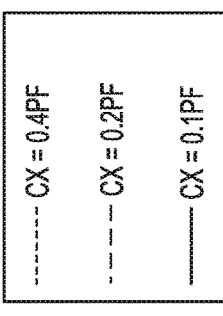
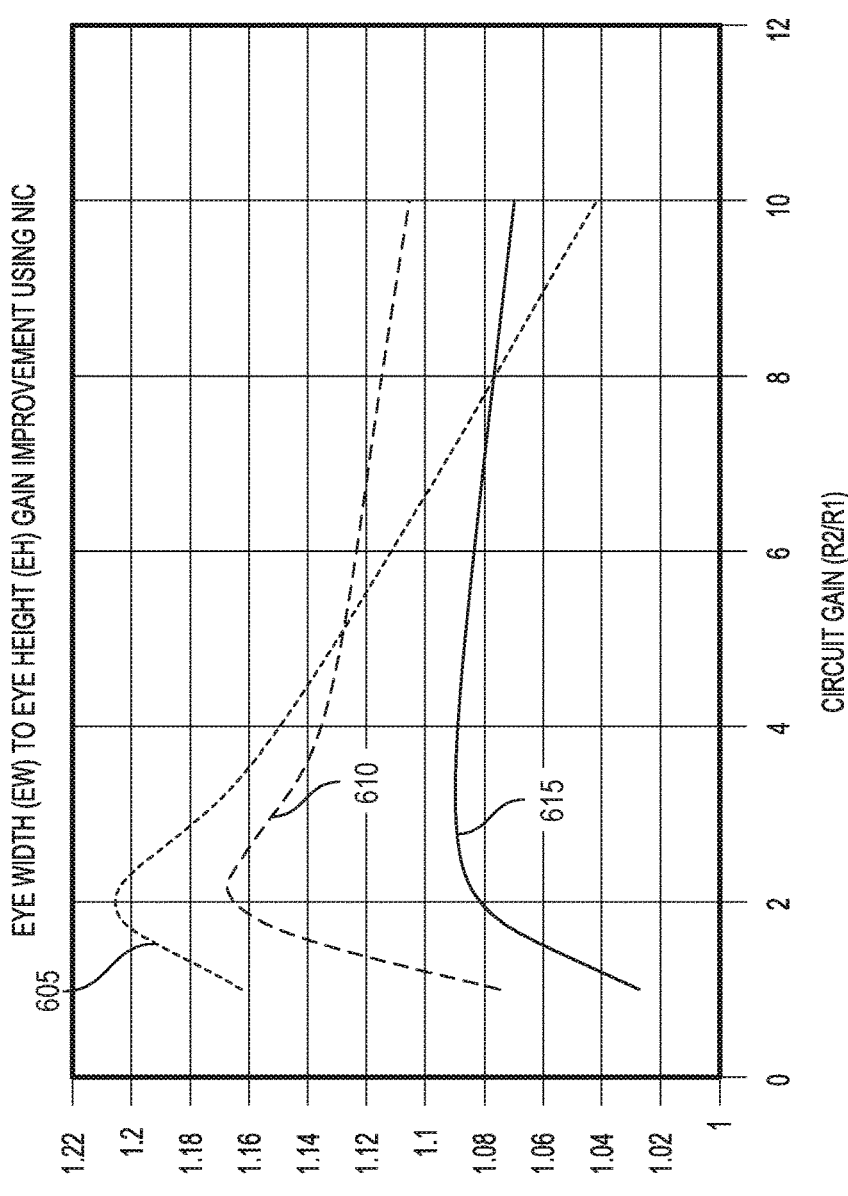
FIG. 6

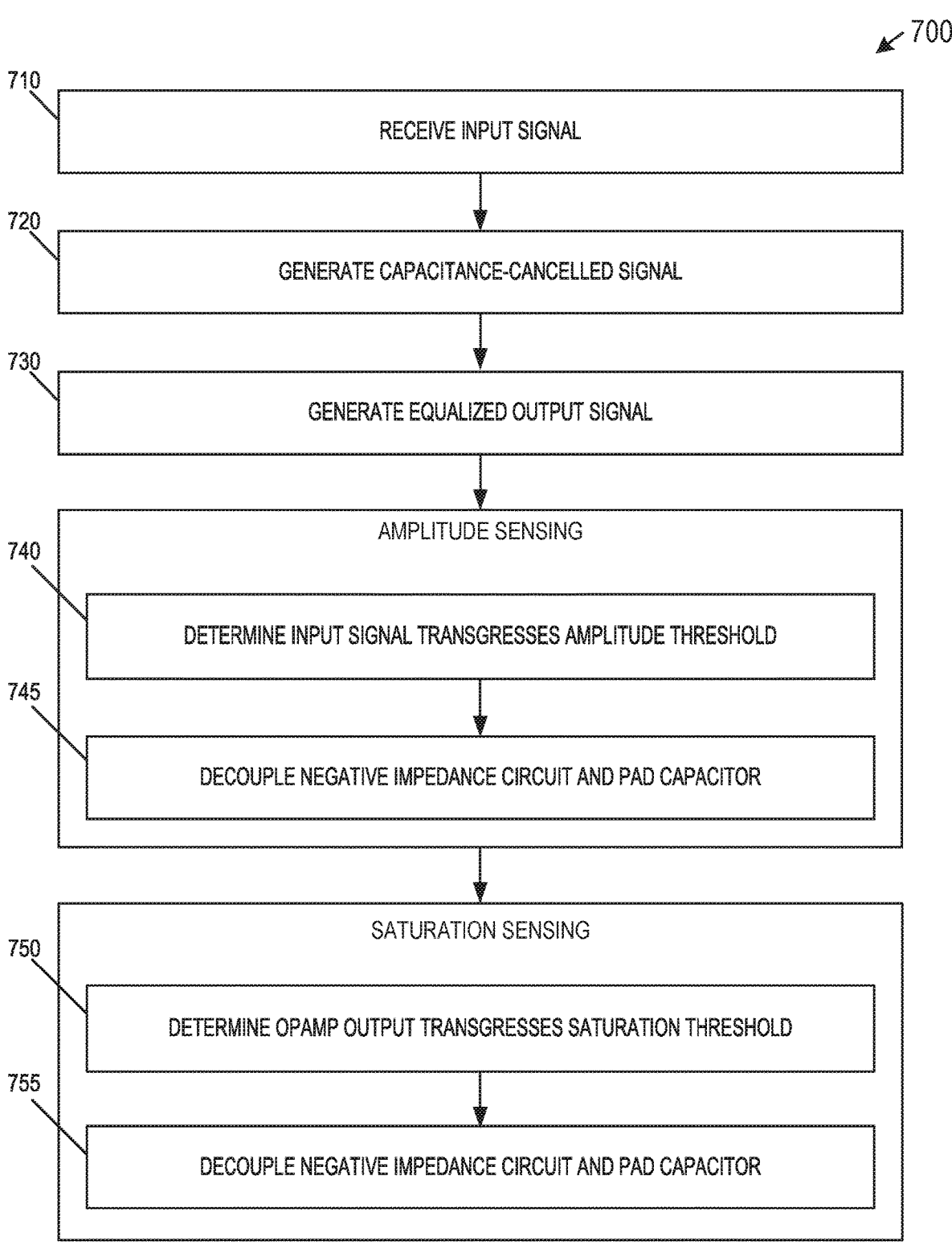

700

710   RECEIVE INPUT SIGNAL

720   GENERATE CAPACITANCE-CANCELLED SIGNAL

730   GENERATE EQUALIZED OUTPUT SIGNAL

AMPLITUDE SENSING

740   DETERMINE INPUT SIGNAL TRANSGRESSES AMPLITUDE THRESHOLD

745   DECOUPLE NEGATIVE IMPEDANCE CIRCUIT AND PAD CAPACITOR

SATURATION SENSING

750   DETERMINE OPAMP OUTPUT TRANSGRESSES SATURATION THRESHOLD

755   DECOUPLE NEGATIVE IMPEDANCE CIRCUIT AND PAD CAPACITOR

FIG. 7

INPUT/OUTPUT CAPACITANCE REDUCTION WITH NEGATIVE IMPEDANCE

TECHNICAL FIELD

Embodiments described herein generally relate to input/output (I/O) circuits for electronic devices.

BACKGROUND

Data transfer rates (e.g., bandwidth) input to and output from electronic devices are a function of I/O pad circuit structure. The load capacitance of an I/O pad may reduce the bandwidth of an I/O circuit. The pad capacitance may be reduced by implementing weak signal drivers, which may include reducing the physical size of the circuit components such as resistors and switches (e.g., metal-oxide-semiconductor field-effect transistor (MOSFET) transistor, tungsten trench (TCN) resistors). The reduced circuit component size results in a smaller pad capacitance, which may avoid reducing the bandwidth of the channel. However, the ability to reduce circuit component size to implement weak signal drivers may be limited to configurations where signal integrity requirements allow for a high resistance driver. Weak drivers naturally reduce the solution space available for signaling into the channel and increase channel complexity.

The pad capacitance may be reduced by designing a weak driver architecture. This may include implementing a reduced or minimized metal routing grid at the pad, which in turn reduces or minimizes physical capacitance at the pad. However, this introduces issues related to electromigration and self-heat, especially when keeping the MOS switches and resistors at their design size and reducing the amount of metal. In particular, a minimalistic grid at the pad is detrimental to reliability and ESD performance. What is needed is an improved I/O pad circuit.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which:

FIGS. 1A-1B is a circuit diagram illustrating bridged T-coil circuits, according to an embodiment.

FIG. 4 is a graph illustrating a NIC transient waveform, according to an embodiment.

FIG. 6 is a graph illustrating a NIC gain improvement, according to an embodiment.

FIG. 7 is a flowchart illustrating a method for capacitance cancelling, according to an embodiment.

DETAILED DESCRIPTION

In the following description, for purposes of explanation, numerous specific details are set forth to provide a thorough understanding of some example embodiments. It will be evident, however, to one skilled in the art that the present disclosure may be practiced without these specific details.

FIGS. 1A-1B is a circuit diagram illustrating bridged T-coil circuits 100, according to an embodiment. The bridged T-coil circuits 100 may provide a passive resonant circuit between input 125 and output 135, which may be used to increase channel bandwidth. FIG. 1A shows a bridged T-coil circuit that includes a capacitance load CL 140 that is to be reduced. Switch M1 130 and resistor RD 105 form a common source amplifier. The bridged T-coil is formed by the bridging capacitor CB 110 and the mutually coupled inductors L1 120 and L2 115.

A small-signal equivalent of bridged T-coil circuit is shown in FIG. 1B. FIG. 1B includes a similar bridging capacitor CB 110 and mutually coupled inductors L1 120 and L2 115, but omits the capacitance load CL 140 shown in FIG. 1A. To provide the desired signal performance, small-signal circuit shown in FIG. 1B may be implemented with an assumption that the small signal drain-source impedance of resistor R0 145 is much greater than the impedance of resistor RD 155.

Figure 2:
FIG. 2 is a circuit diagram illustrating a reduced pad capacitance circuit, according to an embodiment.

FIG. 2 is a circuit diagram illustrating a reduced pad capacitance circuit 200, according to an embodiment. Circuit 200 may receive an input signal 205 through a transmission line 210 to a capacitive pad 215. To reduce or eliminate the positive and physical pad capacitance associated with capacitive pad 215, the circuit 200 implements a negative capacitance using first pad capacitor 220 with capacitance $-N \times C_{PAD}$ (N<1). This negative capacitance reduces or minimizes poor signal quality arising from large pad capacitance. This improved signal may be fed into a comparator 235 along with a comparator reference input 240. Inside comparator 235, the signal may be improved further using one or more of a linear filter (e.g., a continuous time linear equalizer (CTLE)) and a non-linear filter (e.g., a decision feedback equalizer (DFE)). The final signal can be buffered into the core.

The use of negative capacitance in circuit 200 will increase the transmit (TX) signaling quality and RX signaling quality of I/O interfaces. Improved signaling quality will make additional equalization techniques like the CTLE or DFE more effective for generating improved eye margins (e.g., FIG. 5). This circuit 200 provides improved performance over bridged T-coils, such as being implemented within a smaller on-chip area than required for bridged T-coils. Circuit 200 also avoids mutual inductive coupling typically required for T-coils. Because any inductive loop influences signals running on nearby conductive wires, circuit 200 provides improved performance for multi-lane links (e.g., double data rate (DDR) links). Additionally, because inductive peaking is frequency dependent, the output impedance is undesirably a function of the frequency of operation, so the T-coil method is suited for a fixed frequency usage. In contrast, circuit 200 provides improved performance for DDR or Peripheral Component Interconnect express (PCIe) type wireline digital signaling, where the method of pad capacitance reduction shown in circuit 200 is more suitable for variable-frequency operation. Variable frequency is a consequence of the activity factor and digital data pattern on the bus, so circuit 200 may provide improved performance for dynamic and varying activity factors and data patterns.

The NIC provides several advantages over solutions employing only a T-coil. Regarding data rate (e.g., frequency) independence, a NIC cancels pad cap without any dependence on input frequency (e.g., data rate), as the underlying mechanism with the NIC is to create a true negative component. This provides improvements over T-coils that implement an alteration of the impedance in the frequency domain.

Regarding layout, the NIC circuits described herein use a receiver operational amplifier (opamp) augmented with feedback capacitors and resistors. As capacitors and resistors are common circuit components, they do not require special expertise or technology for implementation within a circuit, and may be implemented within a small circuit area. In contrast, T-coils include passive metal coils, and are therefore less efficient in circuit surface area and in requiring z-height for the metal coil structures.

Regarding magnetic fields, the NIC circuit produces only the fields one might associate with a simple wire carrying electric current. This provides improved performance in I/O circuits that may be affected by magnetic fields, such as by the magnetic fields required for inductive coupling in T-coil circuits.

Regarding device output resistance independence, the NIC responds to an input signal at a transistor gate, which provides a more efficient and simpler circuit design. In contrast, T-coil circuits typically makes its transistor drain visible to a signal, which often requires large output resistance (operation in saturation region) at the pad and may be difficult to implement.

Regarding incoming signal quality, the NIC circuits provide an electromagnetically silent electrical device with no inductive influence on the pad. In contrast, the T-coil circuits may affect input signal quality, such as by introducing an inductive-kick.

Regarding electrostatic discharge (ESD), the NIC circuits do not require redesigning or reevaluating any traditional ESD structures. In contrast, T-coil circuits typically require altering I/O pad characteristics and reevaluation of ESD performance.

Figure 3:
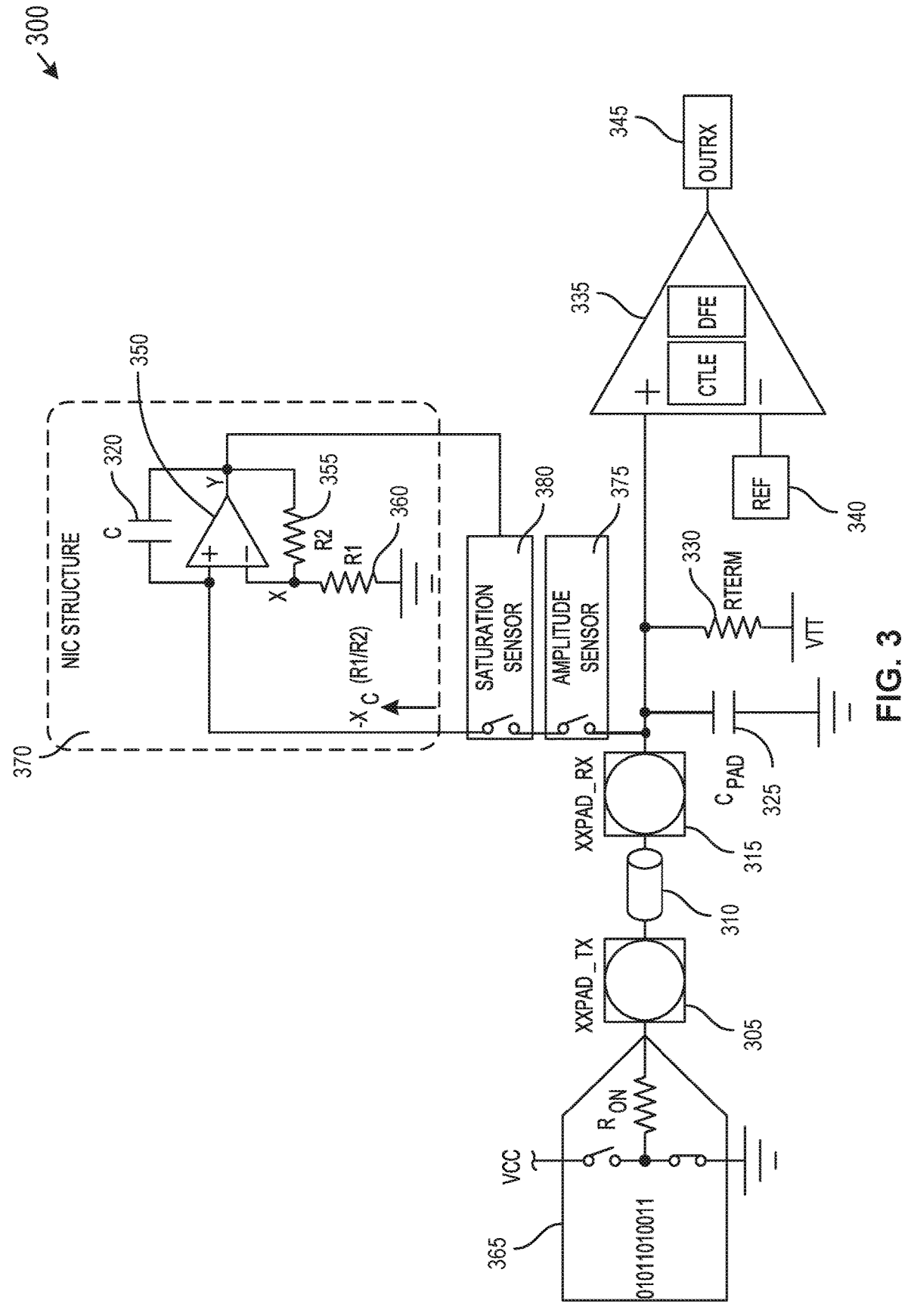
FIG. 3 is a circuit diagram illustrating a negative impedance converter (NIC) circuit, according to an embodiment.

FIG. 3 is a circuit diagram illustrating a negative impedance converter (NIC) circuit 300, according to an embodiment. The NIC circuit 300 includes features in common with reduced pad capacitance circuit 200, including an input signal 365 through a first capacitive pad 305, a communication pipeline 310, a second capacitive pad 315, comparator 335 with an integrated CTLE and DFE, and comparator reference input 340.

To reduce or eliminate the positive and physical pad capacitance, NIC circuit is implemented with a direct current (DC) blocking NIC structure 370. The NIC structure 370 implements $Z_{in}=v(\text{xxpad\_rx})/(-iC)$. The termination resistor RTERM 330 may be biased to a tracking termination voltage $V_{TT}$, which may be set to terminate to any desired voltage. NIC structure 370 includes a NIC capacitor 320, first NIC resistor 355, second NIC resistor 360, and operational amplifier (opamp) 350. By positioning the NIC capacitor 320 between the positive input of the NIC opamp 350 and the output of the NIC opamp 350, the common mode of the incoming signal is unaltered by the NIC structure 370. In an example, the NIC opamp 350 may be implemented using bandwidth requirements that are similar to the bandwidth of the comparator 335. While opamp 350 is shown as an opamp with two differential inputs, a single input topology may be implemented using an internally defined reference voltage $V_{REF}$.

4

TABLE 1

| NIC and Channel Circuit Parameters | | | | | |
|---|---|---|---|---|---|
| # | Parameter | Variable | Unit | Value | Notes |
| | NIC | | | | |
| 1 | Opamp flatband gain | Av | dB | 30 | Low frequency gain. |
| 2 | Opamp unity gain frequency | Gx | GHz | 10 | Unity gain bandwidth. |
| 3 | Gain bandwidth | GBW | GHz | 300 | |
| 4 | NIC cap | Cx | pF | Var | A discrete set of 0.1, 0.2 and 0.3 pF were used as the reference value to negate and amplify. The best performer was 0.2 pF as shown in FIG. 6. |
| 5 | NIC | R2 | kΩ | 5 | |
| 6 | NIC | R1 | kΩ | 10 | |
| | Channel | | | | |
| 7 | Inherent pad capacitance | Cpad | pF | 2 | Pad capacitance alleviated with the NIC. |
| 8 | Link impedance | Z0 | Ω | 50 | Nominal value. |

NIC circuit 300 may further include an amplitude sensor 375. When receiving large input signals, the NIC structure 370 may saturate and provide a reduced benefit. Amplitude sensor 375 may be used to switch off the NIC structure 370 when an input signal transgresses (e.g., rises above) a predetermined input amplitude threshold. The predetermined input amplitude threshold may include a static threshold or a dynamic threshold, and may be based on a first-order approximation of the maximum amplitude based on the circuit parameters of NIC structure 370. Similarly, a saturation sensor 380 may be used to detect when the output of the NIC opamp 350 saturates, such as a saturation if excess gain is applied to a small signal swing. The saturation sensor 380 may detect when the NIC opamp 350 saturates by detecting when the output of the NIC opamp 350 transgresses a predetermined saturation threshold, and may disconnect the NIC structure 370 to reduce or minimize wasted power.

While NIC structure 370 may be implemented without requiring calibration, further improvements in gain control and linearity may be provided via calibration or training. In an example, an optimal gain setting may be determined, and registers may be set manually based on that determined optimal gain setting. Even if incorrect settings were used, such as if the gain setting were determined incorrectly or the registers set incorrectly, one or both of the amplitude sensor 375 and the saturation sensor 380 may be used to monitor and isolate the NIC structure 370. When using calibrated values for NIC structure 370 circuit components (e.g., based on predetermined optimal gain settings), the reduction in pad capacitance provided by NIC structure 370 will result in improvements in amplitude and edge rate of the incoming signal, such as shown in FIG. 4.

FIG. 4 is a graph illustrating a NIC transient waveform 400, according to an embodiment. The NIC transient waveform 400 shows the transient response at a receiver pad, and was generated in simulation software using a 3.2 GT/s signal with a low-power double data rate 5 (LPDDR5) style ground termination. The NIC transient waveform 400 shows digital input signal 405, NIC receiver pad waveform 410, and non-NIC receiver pad waveform 415. As shown in FIG. 4, the NIC receiver pad waveform 410 shows improved characteristics at the receiver pad, such as improved amplitude and slew rate.

The NIC transient waveform 400 was generated using component values $C_{PAD}$=2 pF, C=[0.1, 0.2, 0.4] pF, R2/R1= [variable], such as for circuit components shown in FIG. 3. The NIC transient waveform 400 was generated using resistor-capacitor (R-C) propagation delay in place of the transmission line (TLINE) such that a clean waveform can be observed. The opamp used in the simulation shown in FIG. 4 was set to a gain-bandwidth (GBW)=300e9 Hz with Av=20 dB. The transmission line used $Z_0$=50Ω and an arbitrary delay of 1 ns.

Figure 5:
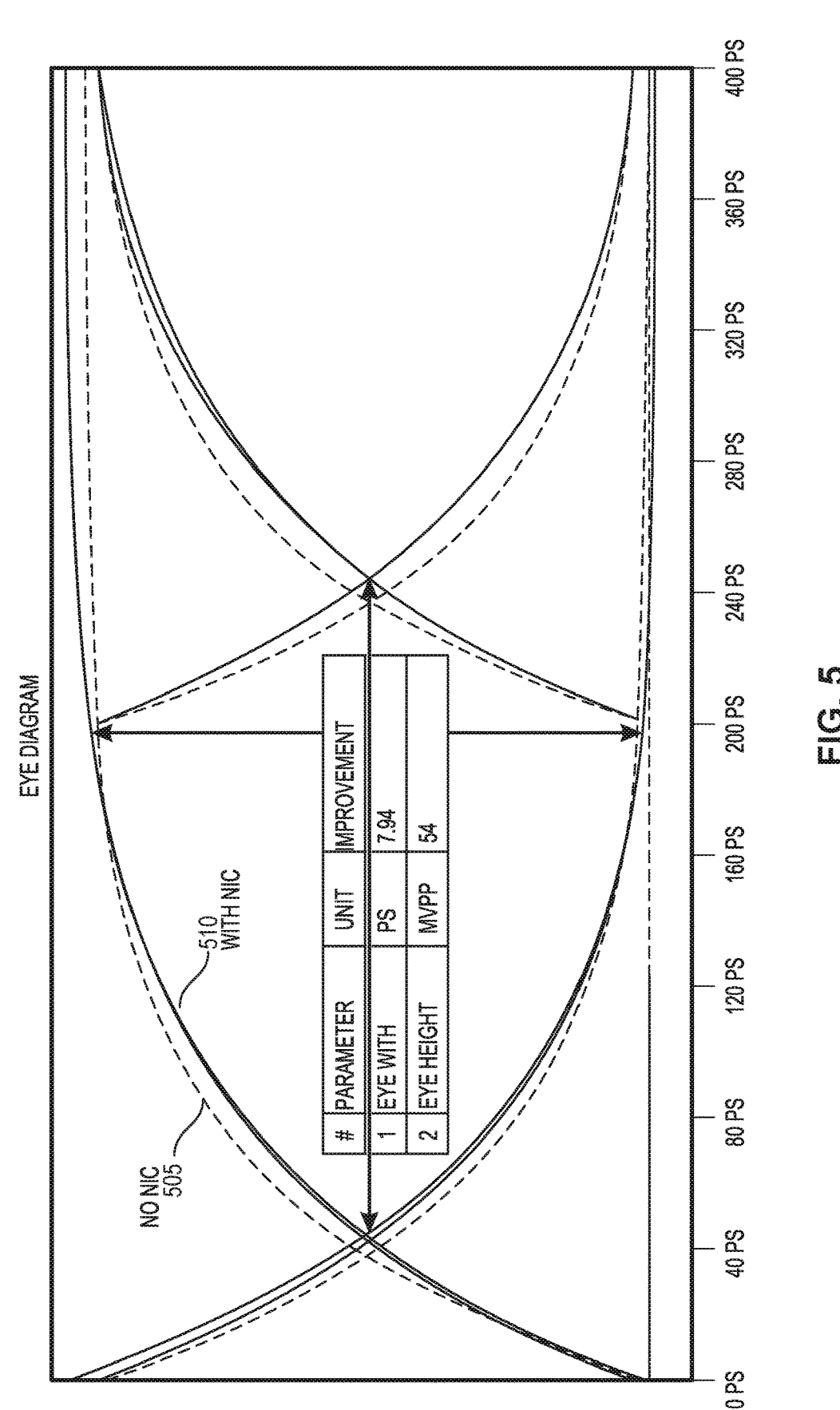
FIG. 5 is a graph illustrating an eye diagram, according to an embodiment.

FIG. 5 is a graph illustrating an eye diagram 500, according to an embodiment. The eye diagram 500 compares the performance when using no NIC 505 with performance using a NIC 510. As can be seen in FIG. 5, the eye width (EW) improves by 7.94 ps, and the eye height (EH) improves by 54 mV peak-to-peak (mVpp). Eye diagram 500 also shows a rightward shift (e.g., time delay) caused by extra loading by the NIC, however the performance benefits when using a NIC 510 exhibit the same performance improvements over using no NIC 505. Eye diagram 500 was generated using parameters similar to FIG. 4 except for the use of TLINE and a unit interval (UI) of approximately 200 ps (e.g., 5 GT/s data rate), which is consistent with the 5 GT/s data rate of current double data rate (DDR) interface speeds.

FIG. 6 is a graph illustrating a NIC gain improvement 600, according to an embodiment. The NIC gain improvement 600 shows eye width (EW) to eye height (EH) performance (e.g., normalized eye area) as a ratio (e.g., gain) from the NIC-based design versus a reference design without the NIC as a function of R2/R1 circuit gain. The R2/R1 circuit gain may be configured by selecting values for R1 and R2 within NIC structure 370 shown in FIG. 3. The NIC gain improvement 600 shows three values for the NIC capacitor, including 0.4 pF 605, 0.2 pF 610, and 0.1 pF 615.

As can be seen in FIG. 6, the NIC gain at which the peak occurs corresponds to a circuit gain of approximately two, which represents the desirable operating point. Each of the EW-EH gain lines decreases with increasing circuit gain due to amplitude saturation at the output of the NIC. In an example, the middle gain line corresponding to 0.2 pF 610 may be selected as providing a desired high initial EW-EH gain and a more stable EW-EH gain with increasing circuit gain. An optimal gain may be determined based on various considerations, such as desired circuit gain or operating under various frequency conditions, such as to maximize the total area under the EW-EH gain plot. The circuit gain may be determined through simulation or lab testing, or may be tuned dynamically while the device is operating, such as using variable resistors or variable capacitors within the NIC circuitry.

FIG. 7 is a flowchart illustrating a method 700 for capacitance cancelling, according to an embodiment. Method 700 includes receiving 710 an input signal from a signal conductor pad and generating 720 a capacitance-cancelled signal at a capacitance cancelling circuit based on the input signal. The negative impedance circuit includes an operational amplifier with a non-inverting opamp input conductively coupled to receive the input signal from the pad capacitor, a direct current blocking capacitor conductively coupled between the non-inverting opamp input and an opamp output, a first resistor conductively coupled between an inverting opamp input and a ground, and a second resistor conductively coupled between the inverting opamp input and the opamp output. The pad capacitor may be associated with a pad capacitance, and the negative impedance circuit may be configured to negate the pad capacitance. The pad capacitor may be conductively coupled between the signal conductor pad and a ground conductor, and the termination resistor may be conductively coupled between the pad capacitor and a tracking termination voltage.

Method 700 may further include generating 730 an equalized output signal at a comparator circuit. The comparator circuit may include a first comparator terminal coupled to the negative impedance circuit and the signal conductor pad, a second comparator terminal coupled to a reference input, and an equalizer to generate an equalized output signal based on the capacitance-cancelled signal. The equalizer may include at least one of a continuous time linear equalizer and a decision feedback equalizer. The direct current blocking capacitor may be associated with a blocking capacitance, and the blocking capacitance may be selected to provide an improvement in performance of the equalized output signal. The first resistor may be associated with a first resistance, the second resistor may be associated with a second resistance, and the first resistance may be selected to be substantially double the second resistance.

Method 700 may further include determining 740 that the input signal transgresses an amplitude threshold at an amplitude sensor circuit coupled between the negative impedance circuit and the pad capacitor. Method 700 may further include decoupling 745 the negative impedance circuit and the pad capacitor in response to determining that the input signal transgresses the amplitude threshold.

Method 700 may further include determining 750 that the opamp output transgresses a saturation threshold at a saturation sensor circuit. The saturation sensor circuit may be coupled between the negative impedance circuit and the pad capacitor and coupled to the opamp output of the negative impedance circuit. Method 700 may further include decoupling 755 the negative impedance circuit and the pad capacitor in response to determining that the opamp output transgresses the saturation threshold.

Figure 8:
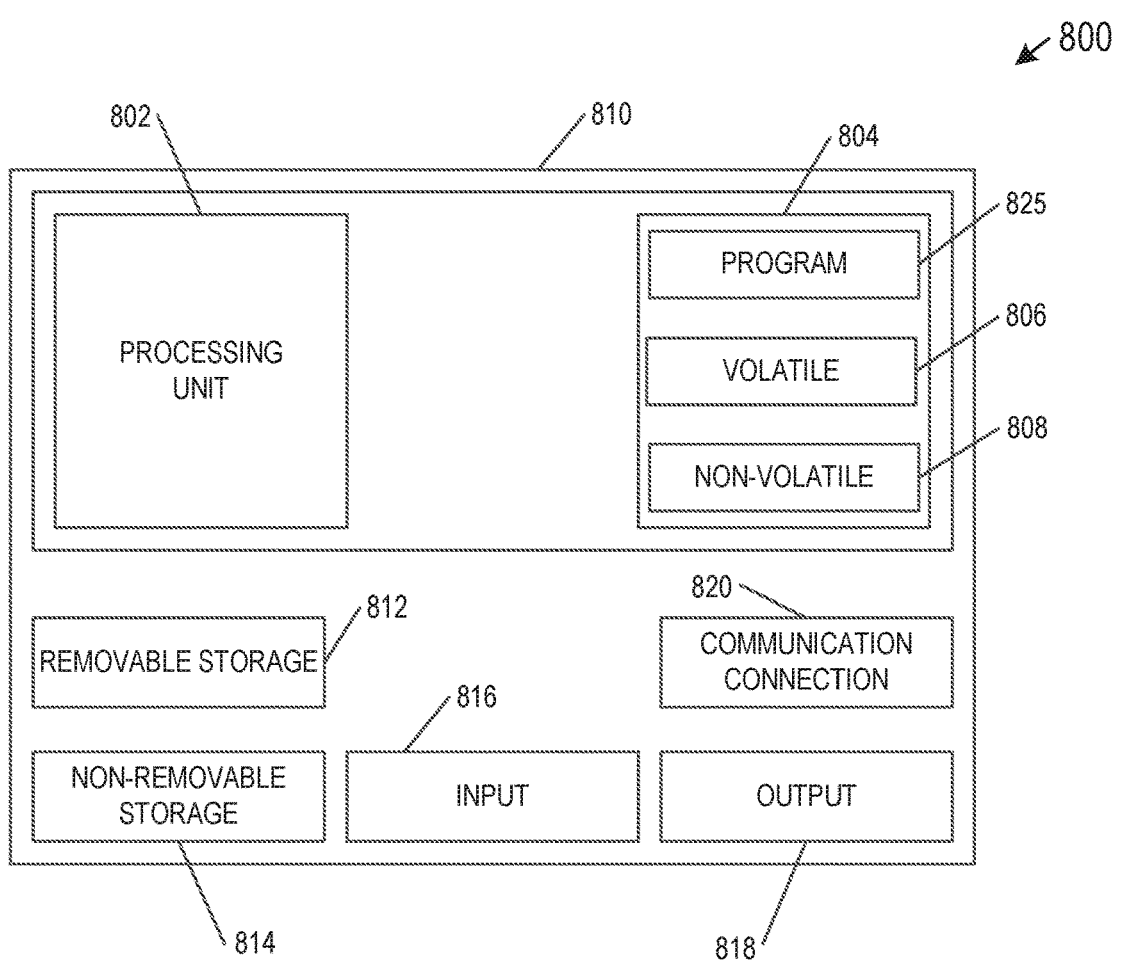
FIG. 8 is a block diagram of a computing device, according to an embodiment.

FIG. 8 is a block diagram of a computing device 800, according to an embodiment. The performance of one or more components within computing device 800 may be improved by including one or more of the circuits or circuitry methods described herein. Computing device 800 may include a capacitance cancelling circuit to generate a capacitance-cancelled signal based on an input signal received from a signal conductor pad and a comparator circuit to generate an equalized output based on the capacitance-cancelled signal.

In one embodiment, multiple such computer systems are used in a distributed network to implement multiple components in a transaction-based environment. An object-oriented, service-oriented, or other architecture may be used to implement such functions and communicate between the multiple systems and components. In some embodiments, the computing device of FIG. 8 is an example of a client device that may invoke methods described herein over a network. In some embodiments, the computing device of FIG. 8 is an example of one or more of the personal computer, smartphone, tablet, or various servers.

One example computing device in the form of a computer 810, may include a processing unit 802, memory 804, removable storage 812, and non-removable storage 814. Although the example computing device is illustrated and described as computer 810, the computing device may be in different forms in different embodiments. For example, the computing device may instead be a smartphone, a tablet, or other computing device including the same or similar elements as illustrated and described with regard to FIG. 8. Further, although the various data storage elements are illustrated as part of the computer 810, the storage may include cloud-based storage accessible via a network, such as the Internet.

Returning to the computer 810, memory 804 may include volatile memory 806 and non-volatile memory 808. Computer 810 may include or have access to a computing environment that includes a variety of computer-readable media, such as volatile memory 806 and non-volatile memory 808, removable storage 812 and non-removable storage 814. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 810 may include or have access to a computing environment that includes input 816, output 818, and a communication connection 820. The input 816 may include one or more of a touchscreen, touchpad, mouse, keyboard, camera, and other input devices. The input 816 may include a navigation sensor input, such as a GNSS receiver, a SOP receiver, an inertial sensor (e.g., accelerometers, gyroscopes), a local ranging sensor (e.g., LIDAR), an optical sensor (e.g., cameras), or other sensors. The computer may operate in a networked environment using a communication connection 820 to connect to one or more remote computers, such as database servers, web servers, and another computing device. An example remote computer may include a personal computer (PC), server, router, network PC, a peer device or other common network node, or the like. The communication connection 820 may be a network interface device such as one or both of an Ethernet card and a wireless card or circuit that may be connected to a network. The network may include one or more of a Local Area Network (LAN), a Wide Area Network (WAN), the Internet, and other networks.

Computer-readable instructions stored on a computer-readable medium are executable by the processing unit 802 of the computer 810. A hard drive (magnetic disk or solid state), CD-ROM, and RAM are some examples of articles including a non-transitory computer-readable medium. For example, various computer programs 825 or apps, such as one or more applications and modules implementing one or more of the methods illustrated and described herein or an app or application that executes on a mobile device or is accessible via a web browser, may be stored on a non-transitory computer-readable medium.

The apparatuses and methods described above may include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3

(Motion Picture Experts Group, Audio Layer 3) players), vehicles, medical devices (e.g., heart monitors, blood pressure monitors, etc.), set top boxes, and others.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" may mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A may include a single element or multiple elements. Item B may include a single element or multiple elements. Item C may include a single element or multiple elements.

In the detailed description and the claims, a list of items joined by the term "one of" may mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A may include a single element or multiple elements. Item B may include a single element or multiple elements. Item C may include a single element or multiple elements.

ADDITIONAL NOTES AND EXAMPLES

Example 1 is a circuit comprising: a signal conductor pad to receive an input signal; a pad capacitor conductively coupled to the signal conductor pad; and a negative impedance circuit including: an operational amplifier with a non-inverting opamp input conductively coupled to receive the input signal from the pad capacitor; a direct current blocking capacitor conductively coupled between the non-inverting opamp input and an opamp output; a first resistor conductively coupled between an inverting opamp input and a ground; and a second resistor conductively coupled between the inverting opamp input and the opamp output.

In Example 2, the subject matter of Example 1 includes wherein: the pad capacitor is associated with a pad capacitance; and the negative impedance circuit is configured to negate the pad capacitance.

In Example 3, the subject matter of Examples 1-2 includes a comparator circuit, the comparator circuit including: a first comparator terminal coupled to the negative impedance circuit and the signal conductor pad; a second comparator terminal coupled to a reference input; and an equalizer to generate an equalized output signal based on the input signal.

In Example 4, the subject matter of Example 3 includes wherein the equalizer includes at least one of a continuous time linear equalizer and a decision feedback equalizer.

In Example 5, the subject matter of Example 4 includes wherein: the direct current blocking capacitor is associated with a blocking capacitance; and the blocking capacitance is selected to provide an improvement in performance of the equalized output signal.

In Example 6, the subject matter of Example 5 includes wherein: the first resistor is associated with a first resistance; the second resistor is associated with a second resistance; and the first resistance is selected to be substantially double the second resistance.

In Example 7, the subject matter of Examples 1-6 includes an amplitude sensor circuit coupled between the negative impedance circuit and the pad capacitor, the amplitude sensor circuit to: determine that the input signal transgresses an amplitude threshold; and decouple the negative imped- ance circuit and the pad capacitor in response to the deter- mination that the input signal transgresses the amplitude threshold.

In Example 8, the subject matter of Examples 1-7 includes a saturation sensor circuit coupled between the negative impedance circuit and the pad capacitor and coupled to the opamp output of the negative impedance circuit, the satu- ration sensor circuit to: determine that the opamp output transgresses a saturation threshold; and decouple the nega- tive impedance circuit and the pad capacitor in response to the determination that the opamp output transgresses the saturation threshold.

In Example 9, the subject matter of Examples 1-8 includes a termination resistor conductively coupled to the pad capacitor, wherein: the pad capacitor is conductively coupled between the signal conductor pad and a ground conductor; and the termination resistor is conductively coupled between the pad capacitor and a tracking termina- tion voltage.

Example 10 is a method comprising: receiving an input signal from a signal conductor pad; and generating a capaci- tance-cancelled signal at a capacitance cancelling circuit based on the input signal, the capacitance cancelling circuit including: a pad capacitor conductively coupled to the signal conductor pad; and a negative impedance circuit including: an operational amplifier with a non-inverting opamp input conductively coupled to receive the input signal from the pad capacitor; a direct current blocking capacitor conduc- tively coupled between the non-inverting opamp input and an opamp output; a first resistor conductively coupled between an inverting opamp input and a ground; and a second resistor conductively coupled between the inverting opamp input and the opamp output.

In Example 11, the subject matter of Example 10 includes wherein: the pad capacitor is associated with a pad capaci- tance; and the negative impedance circuit is configured to negate the pad capacitance.

In Example 12, the subject matter of Examples 10-11 includes generate an equalized output signal at a comparator circuit, the comparator circuit including: a first comparator terminal coupled to the negative impedance circuit and the signal conductor pad; a second comparator terminal coupled to a reference input; and an equalizer to generate an equal- ized output signal based on the capacitance-cancelled signal.

In Example 13, the subject matter of Example 12 includes wherein the equalizer includes at least one of a continuous time linear equalizer and a decision feedback equalizer.

In Example 14, the subject matter of Example 13 includes wherein: the direct current blocking capacitor is associated with a blocking capacitance; and the blocking capacitance is selected to provide an improvement in performance of the equalized output signal.

In Example 15, the subject matter of Example 14 includes wherein: the first resistor is associated with a first resistance; the second resistor is associated with a second resistance; and the first resistance is selected to be substantially double the second resistance.

In Example 16, the subject matter of Examples 10-15 includes determining that the input signal transgresses an amplitude threshold at an amplitude sensor circuit coupled between the negative impedance circuit and the pad capaci- tor; and decoupling the negative impedance circuit and the pad capacitor in response to determining that the input signal transgresses the amplitude threshold.

In Example 17, the subject matter of Examples 10-16 includes determining that the opamp output transgresses a saturation threshold at a saturation sensor circuit, the satu- ration sensor circuit coupled between the negative imped- ance circuit and the pad capacitor and coupled to the opamp output of the negative impedance circuit; and decoupling the negative impedance circuit and the pad capacitor in response to determining that the opamp output transgresses the satu- ration threshold.

In Example 18, the subject matter of Examples 10-17 includes wherein: the capacitance cancelling circuit further includes a termination resistor conductively coupled to the pad capacitor; the pad capacitor is conductively coupled between the signal conductor pad and a ground conductor; and the termination resistor is conductively coupled between the pad capacitor and a tracking termination voltage.

Example 19 is a circuit comprising: a capacitance can- celling circuit to generate a capacitance-cancelled signal based on an input signal received from a signal conductor pad; and a comparator circuit to generate an equalized output based on the capacitance-cancelled signal.

In Example 20, the subject matter of Example 19 includes wherein the capacitance cancelling circuit includes: a pad capacitor conductively coupled to the signal conductor pad to receive the input signal; and a negative impedance circuit including: an operational amplifier with a non-inverting opamp input conductively coupled to receive the input signal from the pad capacitor; a direct current blocking capacitor conductively coupled between the non-inverting opamp input and an opamp output; a first resistor conduc- tively coupled between an inverting opamp input and a ground; and a second resistor conductively coupled between the inverting opamp input and the opamp output.

In Example 21, the subject matter of Example 20 includes the comparator circuit including: a first comparator terminal coupled to the negative impedance circuit and the signal conductor pad; a second comparator terminal coupled to a reference input; and an equalizer to generate an equalized output signal based on the input signal.

In Example 22, the subject matter of Example 21 includes wherein the equalizer includes at least one of a continuous time linear equalizer and a decision feedback equalizer.

In Example 23, the subject matter of Example 22 includes wherein: the direct current blocking capacitor is associated with a blocking capacitance; and the blocking capacitance is selected to provide an improvement in performance of the equalized output signal.

In Example 24, the subject matter of Example 23 includes wherein: the first resistor is associated with a first resistance; the second resistor is associated with a second resistance; and the first resistance is selected to be substantially double the second resistance.

In Example 25, the subject matter of Examples 20-24 includes wherein the capacitance cancelling circuit further includes an amplitude sensor circuit coupled between the negative impedance circuit and the pad capacitor, the ampli- tude sensor circuit to: determine that the input signal trans- gresses an amplitude threshold; and decouple the negative impedance circuit and the pad capacitor in response to the determination that the input signal transgresses the amplitude threshold.

In Example 26, the subject matter of Examples 20-25 includes wherein the capacitance cancelling circuit further includes a saturation sensor circuit coupled between the negative impedance circuit and the pad capacitor and coupled to the opamp output of the negative impedance circuit, the saturation sensor circuit to: determine that the opamp output transgresses a saturation threshold; and decouple the negative impedance circuit and the pad capacitor in response to the determination that the opamp output transgresses the saturation threshold.

In Example 27, the subject matter of Examples 20-26 includes a termination resistor conductively coupled to the pad capacitor; wherein: the pad capacitor is conductively coupled between the signal conductor pad and a ground conductor; and the termination resistor is conductively coupled between the pad capacitor and a tracking termination voltage.

Example 28 is at least one machine-readable medium including instructions that, when executed by processing circuitry, cause the processing circuitry to perform operations to implement of any of Examples 1-27.

Example 29 is an apparatus comprising means to implement of any of Examples 1-27.

Example 30 is a system to implement of any of Examples 1-27.

Example 31 is a method to implement of any of Examples 1-27.

The subject matter of any Examples above may be combined in any combination.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A circuit comprising:
a signal conductor pad to receive an input signal;
a pad capacitor conductively coupled to the signal conductor pad; and
a negative impedance circuit including:
an operational amplifier with a non-inverting opamp input conductively coupled to receive the input signal from the pad capacitor;
a direct current blocking capacitor conductively coupled between the non-inverting opamp input and an opamp output;
a first resistor conductively coupled between an inverting opamp input and a ground; and
a second resistor conductively coupled between the inverting opamp input and the opamp output.

2. The circuit of claim 1, wherein:
the pad capacitor is associated with a pad capacitance; and
the negative impedance circuit is configured to negate the pad capacitance.

3. The circuit of claim 1, further including a comparator circuit, the comparator circuit including:
a first comparator terminal coupled to the negative impedance circuit and the signal conductor pad;
a second comparator terminal coupled to a reference input; and
an equalizer to generate an equalized output signal based on the input signal.

4. The circuit of claim 3, wherein the equalizer includes at least one of a continuous time linear equalizer and a decision feedback equalizer.

5. The circuit of claim 4, wherein:
the direct current blocking capacitor is associated with a blocking capacitance; and
the blocking capacitance is selected to provide an improvement in performance of the equalized output signal.

6. The circuit of claim 5, wherein:
the first resistor is associated with a first resistance;
the second resistor is associated with a second resistance; and
the first resistance is selected to be substantially double the second resistance.

7. The circuit of claim 1, further including an amplitude sensor circuit coupled between the negative impedance circuit and the pad capacitor, the amplitude sensor circuit to:
determine that the input signal transgresses an amplitude threshold; and
decouple the negative impedance circuit and the pad capacitor in response to the determination that the input signal transgresses the amplitude threshold.

8. The circuit of claim 1, further including a saturation sensor circuit coupled between the negative impedance circuit and the pad capacitor and coupled to the opamp output of the negative impedance circuit, the saturation sensor circuit to:
determine that the opamp output transgresses a saturation threshold; and
decouple the negative impedance circuit and the pad capacitor in response to the determination that the opamp output transgresses the saturation threshold.

9. A method comprising:
receiving an input signal from a signal conductor pad; and
generating a capacitance-cancelled signal at a capacitance cancelling circuit based on the input signal, the capacitance cancelling circuit including:
a pad capacitor conductively coupled to the signal conductor pad; and
a negative impedance circuit including:
an operational amplifier with a non-inverting opamp input conductively coupled to receive the input signal from the pad capacitor;
a direct current blocking capacitor conductively coupled between the non-inverting opamp input and an opamp output;
a first resistor conductively coupled between an inverting opamp input and a ground; and
a second resistor conductively coupled between the inverting opamp input and the opamp output.

10. The method of claim 9, wherein:
the pad capacitor is associated with a pad capacitance; and
the negative impedance circuit is configured to negate the pad capacitance.

11. The method of claim 9, further including generate an equalized output signal at a comparator circuit, the comparator circuit including:

a first comparator terminal coupled to the negative impedance circuit and the signal conductor pad;

a second comparator terminal coupled to a reference input; and an equalizer to generate an equalized output signal based on the capacitance-cancelled signal.

12. The method of claim 11, wherein the equalizer includes at least one of a continuous time linear equalizer and a decision feedback equalizer.

13. The method of claim 12, wherein:

the direct current blocking capacitor is associated with a blocking capacitance; and the blocking capacitance is selected to provide an improvement in performance of the equalized output signal.

14. The method of claim 13, wherein:

the first resistor is associated with a first resistance;

the second resistor is associated with a second resistance; and the first resistance is selected to be substantially double the second resistance.

15. The method of claim 9, further including:

determining that the input signal transgresses an amplitude threshold at an amplitude sensor circuit coupled between the negative impedance circuit and the pad capacitor; and decoupling the negative impedance circuit and the pad capacitor in response to determining that the input signal transgresses the amplitude threshold.

16. The method of claim 9, further including determining that the opamp output transgresses a saturation threshold at a saturation sensor circuit, the saturation sensor circuit coupled between the negative impedance circuit and the pad capacitor and coupled to the opamp output of the negative impedance circuit; and decoupling the negative impedance circuit and the pad capacitor in response to determining that the opamp output transgresses the saturation threshold.

17. A circuit comprising:

a signal conductor pad to receive an input signal;

a capacitance cancelling circuit to generate a capacitance-cancelled signal based on an input signal received from the signal conductor pad, wherein the capacitance cancelling circuit includes:

a pad capacitor conductively coupled to the signal conductor pad to receive the input signal; and a negative impedance circuit including:

an operational amplifier including a non-inverting opamp input conductively coupled to receive the input signal from the pad capacitor, an inverting opamp input, and an opamp output;

a direct current blocking capacitor conductively coupled between the non-inverting opamp input and the opamp output;

an impedance-setting network conductively coupled to the inverting opamp input to define a negative impedance characteristic of the negative impedance circuit; and a comparator circuit to generate an equalized output based on the capacitance-cancelled signal.

18. The circuit of claim 17, the comparator circuit including:

a first comparator terminal coupled to the negative impedance circuit and the signal conductor pad;

a second comparator terminal coupled to a reference input; and an equalizer to generate an equalized output signal based on the input signal.

19. The circuit of claim 18, wherein the equalizer includes at least one of a continuous time linear equalizer and a decision feedback equalizer.

20. The circuit of claim 19, wherein:

the direct current blocking capacitor is associated with a blocking capacitance; and the blocking capacitance is selected to provide an improvement in performance of the equalized output signal.

21. The circuit of claim 20, further including:

a first resistor conductively coupled between an inverting opamp input and a ground, the first resistor is associated with a first resistance;

a second resistor conductively coupled between the inverting opamp input and the opamp output, the second resistor is associated with a second resistance; and the first resistance is selected to be substantially double the second resistance.

22. The circuit of claim 17, wherein the capacitance cancelling circuit further includes an amplitude sensor circuit coupled between the negative impedance circuit and the pad capacitor, the amplitude sensor circuit to:

determine that the input signal transgresses an amplitude threshold; and decouple the negative impedance circuit and the pad capacitor in response to the determination that the input signal transgresses the amplitude threshold.

23. The circuit of claim 17, wherein the capacitance cancelling circuit further includes a saturation sensor circuit coupled between the negative impedance circuit and the pad capacitor and coupled to the opamp output of the negative impedance circuit, the saturation sensor circuit to:

determine that the opamp output transgresses a saturation threshold; and decouple the negative impedance circuit and the pad capacitor in response to the determination that the opamp output transgresses the saturation threshold.

* * * * *